(12) United States Patent
Canario

(10) Patent No.: US 6,222,695 B1
(45) Date of Patent: Apr. 24, 2001

(54) SYSTEM AND METHOD FOR A PREAMPLIFIER WRITE CIRCUIT WITH REDUCED RISE/FALL TIME

(75) Inventor: Ronald A. Canario, San Jose, CA (US)

(73) Assignee: Siemens Microelectronics, Inc., Cupertino, CA (US)

(*) Notice: Subject to any disclaimer, the term of this patent is extended or adjusted under 35 U.S.C. 154(b) by 0 days.

(21) Appl. No.: 09/131,766

(22) Filed: Aug. 10, 1998

(51) Int. Cl.[7] .................................................. G11B 5/02
(52) U.S. Cl. .............................. 360/68; 360/46; 327/110; 365/242
(58) Field of Search ................... 360/68, 67, 46, 360/61; 327/309, 310, 108, 110; 365/242

(56) References Cited

U.S. PATENT DOCUMENTS

| | | |
|---|---|---|
| 3,618,119 | 11/1971 | Rodriguez . |
| 4,551,772 | 11/1985 | Sliger . |
| 4,853,896 | 8/1989 | Yamaguchi . |
| 5,280,196 | 1/1994 | Shinozaki . |
| 5,282,094 | 1/1994 | Ngo . |
| 5,287,231 | 2/1994 | Shier et al. . |
| 5,291,069 | 3/1994 | Gooding et al. . |
| 5,291,347 | 3/1994 | Ngo et al. . |
| 5,296,975 | 3/1994 | Contreras et al. . |
| 5,386,328 | 1/1995 | Chiou et al. . |
| 5,612,828 | 3/1997 | Brannon et al. . |
| 5,638,012 | 6/1997 | Hashimoto et al. . |
| 5,661,680 | 8/1997 | Bergquist et al. . |
| 5,668,676 | 9/1997 | Voorman et al. . |
| 5,680,268 | 10/1997 | Hiromi . |
| 5,751,171 | 5/1998 | Ngo . |
| 5,822,141 | * 10/1998 | Chung et al. .......................... 360/46 |
| 5,841,603 | * 11/1998 | Ramalho et al. ...................... 360/68 |
| 5,869,988 | * 2/1999 | Jusuf ................................. 360/67 X |

FOREIGN PATENT DOCUMENTS

08212504 A    8/1996 (JP) .

OTHER PUBLICATIONS

European Search Report dated Feb. 12, 1999 for application No. EP 99113536.9.
Copy of Search Report for Singapore Appln. No. 9903494–4; date search was completed: Jun. 8, 2000.

* cited by examiner

Primary Examiner—Alan T. Faber
(74) Attorney, Agent, or Firm—Fish & Richardson P.C.

(57) ABSTRACT

A write circuit for facilitating a write head for writing to a memory in a computer is described. The write circuit includes a supply voltage source configured to provide current to the write circuit. The write circuit further includes a current source coupled to the supply voltage source, the current source configured to maintain the current at a predetermined value. The write circuit further includes a switch coupled to the current source, the switch being configured to bypass the current source during a time when the current is changing.

25 Claims, 8 Drawing Sheets

SYSTEM AND METHOD FOR A PREAMPLIFIER WRITE CIRCUIT WITH REDUCED RISE/FALL TIME

FIELD OF THE INVENTION

The present invention relates to integrated circuits. In particular, the present invention relates to a system and method for reducing signal rise/fall time for an integrated circuit used in a disk drive assembly.

BACKGROUND OF THE INVENTION

A preamplifier is an integrated circuit used in a disk drive assembly to condition and process data which are retrieved from and stored on a magnetic storage medium, such as a magnetic disk. "Read" circuits in the preamplifier amplify magnetic signals sensed (retrieved) by a read head flying over the magnetic disk. "Write" circuits in the preamplifier apply signals (current pulses) to a write head to be stored as magnetic signals on the disk.

An example of current pulses applied to a write head by a write circuit is shown in FIG. 1. The current creates a magnetic field which is typically stored on a disk. As the frequency of the current pulses is increased, so is the density of the stored data. Since it is desirable to increase the density of stored data, it is likewise desirable to increase the frequency of the current pulses. The time required for the current to change from its present value to its next value (rise and fall times 10A–10B) ultimately limits the frequency of the pulses, therefore it is desirable to reduce the rise and fall times 10A–10B. Accordingly, if the rise/fall speed of the current applied to the write head increases, the writing speed increases.

It would be desirable to improve the rise/fall speed of the current being applied to the write head in order to increase the speed at which the write head can write data into the magnetic mass storage memory. The present invention addresses such a need.

SUMMARY OF THE INVENTION

Embodiments of the present invention present preamplifier write circuits for increasing the speed at which a write head in a disk drive assembly writes to a memory, such as a magnetic disk memory. The embodiments of the present invention increase the speed at which currents through the write head rise and fall. According to embodiments of the present invention, a current source in the write circuit is bypassed during rise and fall times. Bypassing the current source increases the voltage across the write head, increasing in the rise/fall speed of the current pulses applied to the write head. The embodiments of the present invention allow data to be written faster than conventional write circuits. Accordingly, the density of the data stored on disk is increased.

A write circuit according to an embodiment of the present invention for facilitating a write head for writing to a memory, such as a magnetic disk, in a computer system is presented. The write circuit comprises a supply voltage source configured to provide current to the write circuit. The write circuit also includes a current source coupled to the supply voltage source, the current source being configured to maintain the current at a predetermined value. Additionally, the write circuit also includes a switch coupled to a current source, the switch being configured to bypass the current source during a time when the current is changing.

In another aspect of the present invention, a method according to an embodiment of the present invention for facilitating a write head for writing to a memory in a computer system is also presented. The method comprising steps of providing a current to a write circuit; changing the current; and bypassing a current source during a time when the current is changing.

DETAILED DESCRIPTION OF THE PREFERRED EMBODIMENTS

The following description is presented to enable one of ordinary skill in the art to make and to use the invention and is provided in the context of a patent application and its requirements. Various modifications to the preferred embodiments will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
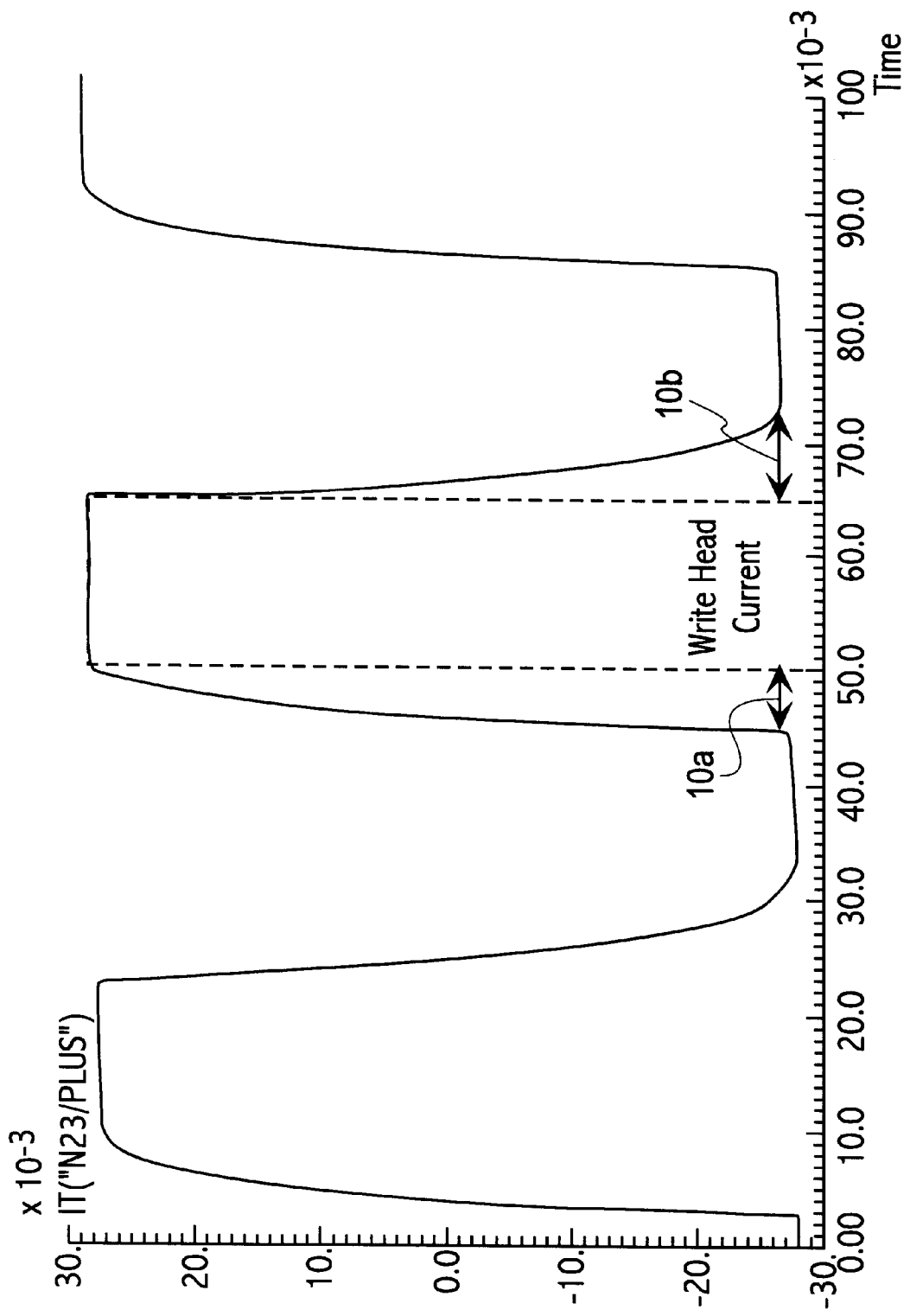
FIG. 1 is an illustration of current pulses applied by a write circuit to a write head.
Figure 2:
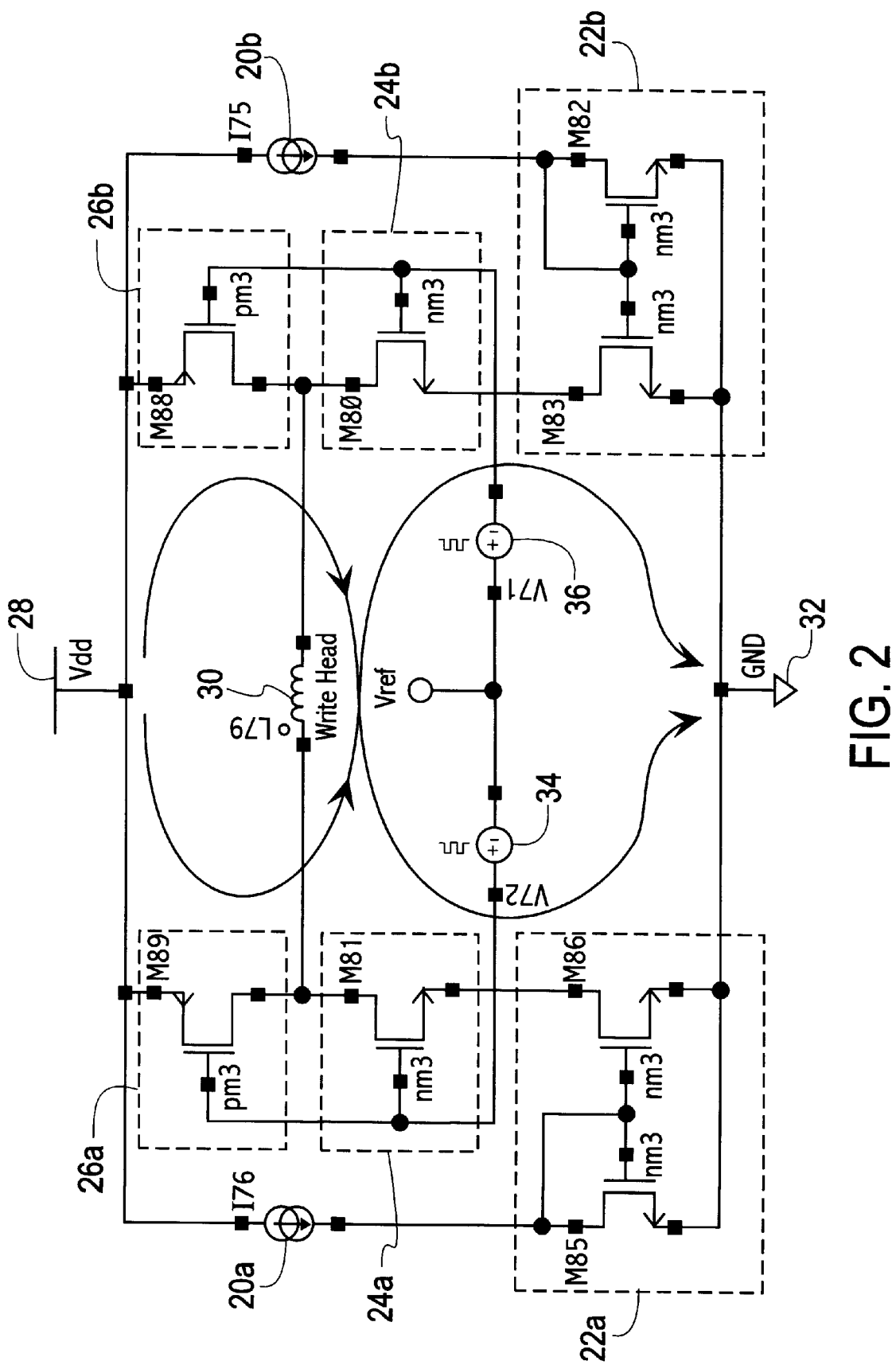
FIG. 2 is a schematic diagram of a conventional write circuit.

FIG. 2 is a schematic diagram of a conventional preamplifier write circuit. The circuit shown in FIG. 2 is a common circuit for driving a write head and is commonly referred to as an "H" bridge. In this circuit, the magnitude of the write head current is set by reference current sources 20A and 20B. Reference current source 20A is reflected through current mirror source 22A. Likewise, reference current source 20B is similarly reflected through current mirror source 22B. During a first half of a write cycle, transistors 24A and 26B are driven "on" by voltage sources 34 and 36. During this time, transistors 24B and 26A are turned "off" by voltage sources 34 and 36. A write current (determined by current mirror source 22A) flows from supply voltage 28 through transistor 26B, write head 30, transistor 24A, into current mirror source 22A, and finally into ground 32.

During a second half of the write cycle, transistors 24B and 26A are turned "on" while transistors 24A and 26B are turned "off". The current is then routed from supply voltage 28 through transistor 26A, write head 30, transistor 24B, and into current mirror source 22B and ground 32.

Accordingly, the current changes directions through write head 30 when changing from the first half of the write cycle to the second half of the write cycle. The intermediate time between the current beginning from a first predetermined value while the current is moving in one direction through write head 30 and the current reaching a second predetermined value while the current is moving in the other direction through write head 30 is the time when the current is changing, such as the rise/fall time.

The current through write head 30 changes in accordance with the equation $$V = L(dI/dt)$$

where V is the instantaneous magnitude of the voltage applied across write head 30, L is the write head inductance, and dI/dt is the current change per increment of time (i.e., the rise/fall time). For a given inductance, the larger the applied voltage, the greater the rate of current change, hence the smaller the rise/fall time. Smaller rise/fall times facilitate a higher write frequency which allows an increase in the speed of data being written into memory, such as a magnetic disk.

For the circuit configuration shown in FIG. 2, the largest theoretical available voltage is the supply voltage 28. Realistically, the voltage available to write head 30 is supply voltage 28 reduced by voltage losses across transistors 24B, 24A, 26B, and 26A, and the bias voltage required by current mirror sources 22A and 22B. Even during the critical time period when the current is changing, such as during rise/fall times, the resistance of the reference current source, as represented by current mirror sources 22A and 22B, is high relative to the resistance of the remaining transistors 26A, 26B, 24A, and 24B. Accordingly, the resistance of current mirror sources 22A and 22B may be the most significant factor in reducing the voltage available for write head 30.

It would be desirable to improve the rise/fall speed of the current being applied to the write head in order to increase the speed at which the write head can write data into memory, such as a magnetic disk. The present invention addresses such a need.

Embodiments of the present invention take advantage of the fact that during the time period when the current is changing, such as rise/fall times, a reference current source for maintaining a predetermined current value is not required. Since the current is changing during rise/fall times, the reference current source is not needed during the rise/fall times to maintain the predetermined value. Only after the changing current has reached its desired final value is it necessary for the reference current source to control and maintain that value.

Figure 3:
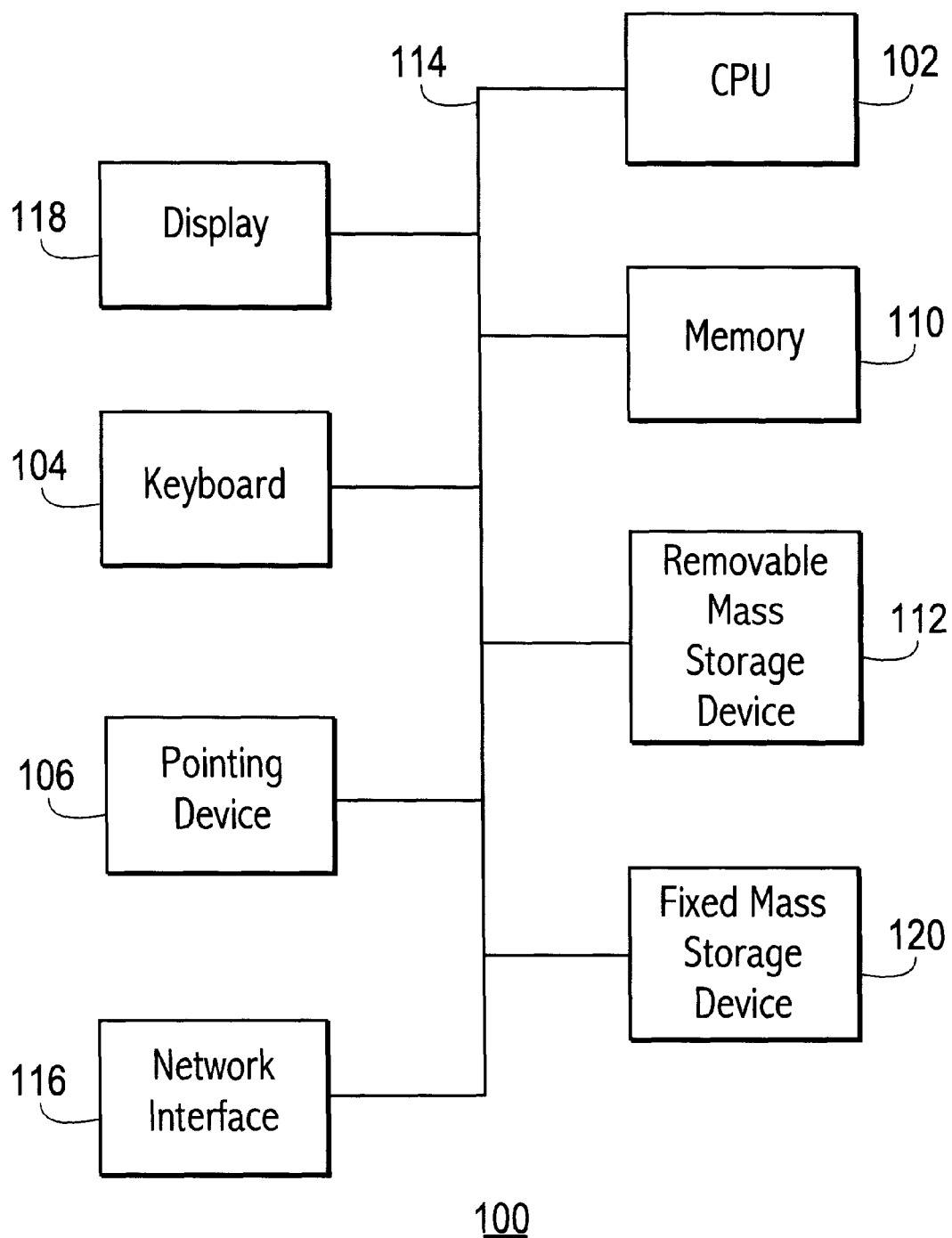
FIG. 3 is a block diagram of a computer system suitable for implementing embodiments of the present invention.

FIG. 3 is a block diagram of a computer system suitable for implementing embodiments of the present invention. FIG. 3 illustrates one embodiment of a general purpose computer system. Other computer system architectures and configurations can be used with the present invention. Computer system 100, made up of various subsystems described below, includes at least one microprocessor subsystem (also referred to as a central processing unit, or CPU) 102. That is, CPU 102 can be implemented by a single-chip processor or by multiple processors. CPU 102 is a general purpose digital processor which controls the operation of the computer system 100. Using instructions retrieved from memory 110, the CPU 102 controls the reception and manipulation of input data, and the output and display of data on output devices.

CPU 102 is coupled bi-directionally with memory 110 which can include a first primary storage, typically a random access memory (RAM), and a second primary storage area, typically a read-only memory (ROM). As is well known in the art, primary storage can be used as a general storage area and as scratch-pad memory, and can also be used to store input data and processed data. It can also store programming instructions and data, in the form of data objects and text objects, in addition to other data and instructions for processes operating on CPU 102. Also as well known in the art, primary storage typically includes basic operating instructions, program code, data and objects used by the CPU 102 to perform its functions. Primary storage devices 110 may include any suitable computer-readable storage media, described below, depending on whether, for example, data access needs to be bidirectional or unidirectional. CPU 102 can also directly and very rapidly retrieve and store frequently needed data in a cache memory (not shown).

A removable mass storage device 112 provides additional data storage capacity for the computer system 100, and is coupled either bi-directionally or uni-directionally to CPU 102. For example, a specific removable mass storage device commonly known as a CD-ROM typically passes data uni-directionally to the CPU 102, whereas a floppy disk can pass data bi-directionally to the CPU 102. Storage 112 may also include computer-readable media such as magnetic tape, flash memory, signals embodied on a carrier wave, PC-CARDS, portable mass storage devices, holographic storage devices, and other storage devices. A fixed mass storage 120 can also provide additional data storage capacity. The most common example of mass storage 120 is a hard disk drive. Mass storage 112, 120 generally store additional programming instructions, data, and the like that typically are not in active use by the CPU 102. It will be appreciated that the information retained within mass storage 112, 120 may be incorporated, if needed, in standard fashion as part of primary storage 110 (e.g. RAM) as virtual memory.

In addition to providing CPU 102 access to storage subsystems, bus 114 can be used to provide access other subsystems and devices as well. In the described embodiment, these can include a display monitor 118, a network interface 116, a keyboard 104, and a pointing device 106, as well as an auxiliary input/output device interface, a sound card, speakers, and other subsystems as needed. The pointing device 106 may be a mouse, stylus, track ball, or tablet, and is useful for interacting with a graphical user interface.

The network interface 116 allows CPU 102 to be coupled to another computer, computer network, or telecommunications network using a network connection as shown. Through the network interface 116, it is contemplated that the CPU 102 might receive information, e.g., data objects or program instructions, from another network, or might output information to another network in the course of performing the above-described method steps. Information, often represented as a sequence of instructions to be executed on a CPU, may be received from and outputted to another network, for example, in the form of a computer data signal embodied in a carrier wave. An interface card or similar device and appropriate software implemented by CPU 102 can be used to connect the computer system 100 to an external network and transfer data according to standard protocols. That is, method embodiments of the present invention may execute solely upon CPU 102, or may be performed across a network such as the Internet, intranet networks, or local area networks, in conjunction with a remote CPU that shares a portion of the processing. Additional mass storage devices (not shown) may also be connected to CPU 102 through network interface 116.

An auxiliary I/O device interface (not shown) can be used in conjunction with computer system 100. The auxiliary I/O device interface can include general and customized interfaces that allow the CPU 102 to send and, more typically, receive data from other devices such as microphones, touch-sensitive displays, transducer card readers, tape readers, voice or handwriting recognizers, biometrics readers, cameras, portable mass storage devices, and other computers.

In addition, embodiments of the present invention further relate to computer storage products with a computer readable medium that contain program code for performing various computer-implemented operations. The computer-readable medium is any data storage device that can store data which can thereafter be read by a computer system. The media and program code may be those specially designed and constructed for the purposes of the present invention, or they may be of the kind well known to those of ordinary skill in the computer software arts. Examples of computer-readable media include, but are not limited to, all the media mentioned above: magnetic media such as hard disks, floppy disks, and magnetic tape; optical media such as CD-ROM disks; magneto-optical media such as floptical disks; and specially configured hardware devices such as application-specific integrated circuits (ASICs), programmable logic devices (PLDs), and ROM and RAM devices. The computer-readable medium can also be distributed as a data signal embodied in a carrier wave over a network of coupled computer systems so that the computer-readable code is stored and executed in a distributed fashion. Examples of program code include both machine code, as produced, for example, by a compiler, or files containing higher level code that may be executed using an interpreter.

The computer system shown in FIG. 3 is but an example of a computer system suitable for use with the invention. Other computer systems suitable for use with the invention may include additional or fewer subsystems. In addition, bus 114 is illustrative of any interconnection scheme serving to link the subsystems. Other computer architectures having different configurations of subsystems may also be utilized.

Figures 4, 5:
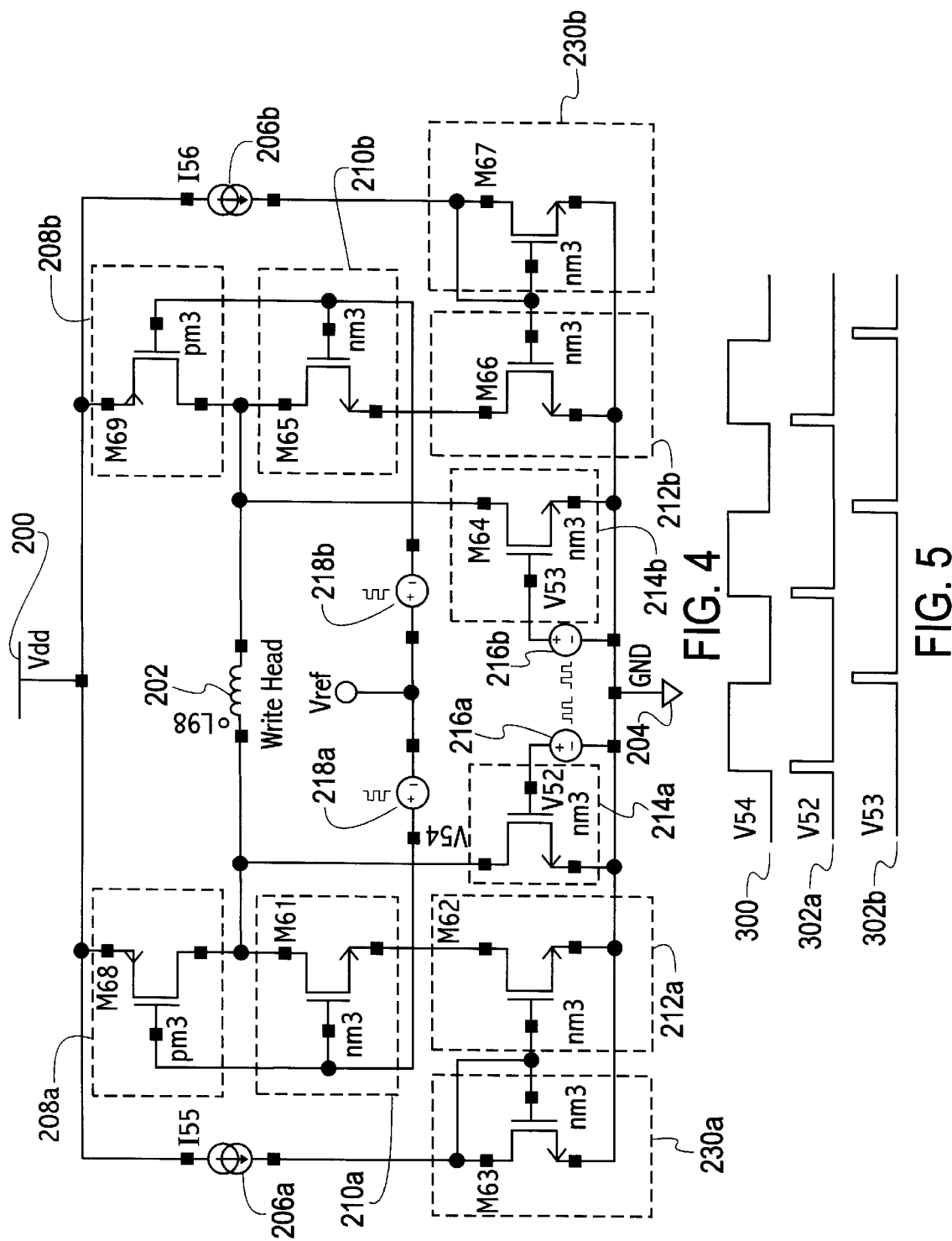
FIG. 4 is a schematic diagram of a write circuit according to a first embodiment of the present invention.
FIG. 5 illustrates various voltage signals applied to the circuit shown in FIG. 4.

FIG. 4 is a schematic diagram of a write circuit according to a first embodiment of the present invention. In the circuit shown in FIG. 4, transistors 214A and 214B serve as switches which seize control of the current such that current mirror sources 212A and 212B are unable to draw the current during rise/fall times. Accordingly, current mirror sources 212A and 212B are bypassed during rise/fall times.

In the circuit shown in FIG. 4, the magnitude of the write head current is set by reference current sources 206A and 206B during times when the current is not changing (non-rise/fall times). Reference current source 206A is reflected by current mirror source 212A and 230A, while reference current source 206B is similarly reflected through current mirror source 212B and 230B. During the first half of the write cycle, transistors 210B and 208A are driven "on" by voltage sources 218A and 218B. A write current (determined by current mirror source 212B and 230B) flows from supply voltage 200 through transistor 208A, and through write head 202 and through transistor 210B.

During a change in the current, such as rise/fall time, transistor 214B is turned "on" by a voltage source 216B. Transistor 214B is switched on, thus providing a low resistance path to ground 204 in shunt with current mirror source 212B. Being "in shunt" with current mirror source 212B is understood to mean that transistor 214B acts as a switch across current mirror source 212B such that current mirror source 212B no longer operates to maintain the current at a predetermined value. By shunting current mirror source 212B, transistor 214B obtains control of the current and forces the current to flow through transistor 214B rather than through current mirror source 212B.

When the current is no longer substantially changing (no longer in rise/fall time), then transistor 214B is turned "off" and the current is allowed to flow through current mirror source 212B. The time that transistor 214B is switched "on" is user configurable.

Accordingly, during rise/fall time, current mirror source 212B is bypassed. During the remainder of the first half of the write cycle, reference current source 206B is reflected in current mirror source 212B and transistor 214B is turned "off".

Similarly, during the second half cycle of the write cycle, transistors 208A and 210B are turned "off", while transistors 208B and 210A are turned "on". Accordingly, current flows from supply voltage 200 through transistor 208B and through write head 202, and through transistor 210A. During rise/fall times, the current flows from write head 202 through transistor 210A and into transistor 214A. During rise/fall times of the second half cycle, transistor 214A is switched "on" by voltage source 216A, thus providing a low resistance path to ground in shunt with current mirror source 212A.

According to this embodiment of the present invention, the voltage that is provided across write head 202 during rise/fall times is approximately source voltage 200 reduced by voltage losses across transistors 208A–208B, 210A–210B, and transistors 214A–214B. Since transistors 214A and 214B provide a low resistance path to ground 204 in shunt with current mirror sources 212A–212B, no head voltage is lost due to current mirror sources 212A–212B during rise/fall times. Additionally, since the voltage loss across transistors 214A–214B are substantially less than the voltage loss across current mirror sources 212A–212B, there is more voltage available to be applied to write head 202 during rise/fall times. Thus, a minimum amount of voltage is subtracted from supply voltage 200 and a maximum amount of voltage is applied across write head 202. Accordingly, the circuit of FIG. 4 maximizes the voltage across write head 202 when the current is changing.

FIG. 5 is an illustration of signals applied to the write circuit shown in FIG. 4 according to an embodiment of the present invention. Signal 300 is a signal typical of one produced by voltage source 218A, and the opposite phase signal would be produced by voltage source 218B. Signal 302A is a signal produced by voltage source 216A to be applied to transistor 214A. Signal 302B is a signal produced by voltage source 216B to be applied to transistor 214B. FIG. 5 shows that voltage signal 302A is turned on at the rise time of the voltage signal 300. Likewise, voltage signal 302B is turned on at the fall time of signal 300. Accordingly, during rise and fall times, voltage sources 216A and 216B are turned "on" alternately through out the rise/fall times of the write cycle to alternately turn on transistors 214A–214B.

The time during which transistors 214A and 214B are turned "on" is user configurable. It is estimated that the risetime ranges from 0.5 nano seconds to 4 nano seconds, depending on various equipment used in conjunction with the write circuit. Since disk drive manufacturers choose the type of write heads used in the drive assembly, the time during which transistors 214A and 214B are turned "on" is configurable based on the type of write head and the manufacturer's predetermined current values selected during the initial alignment of the drive assembly.

Figure 6:
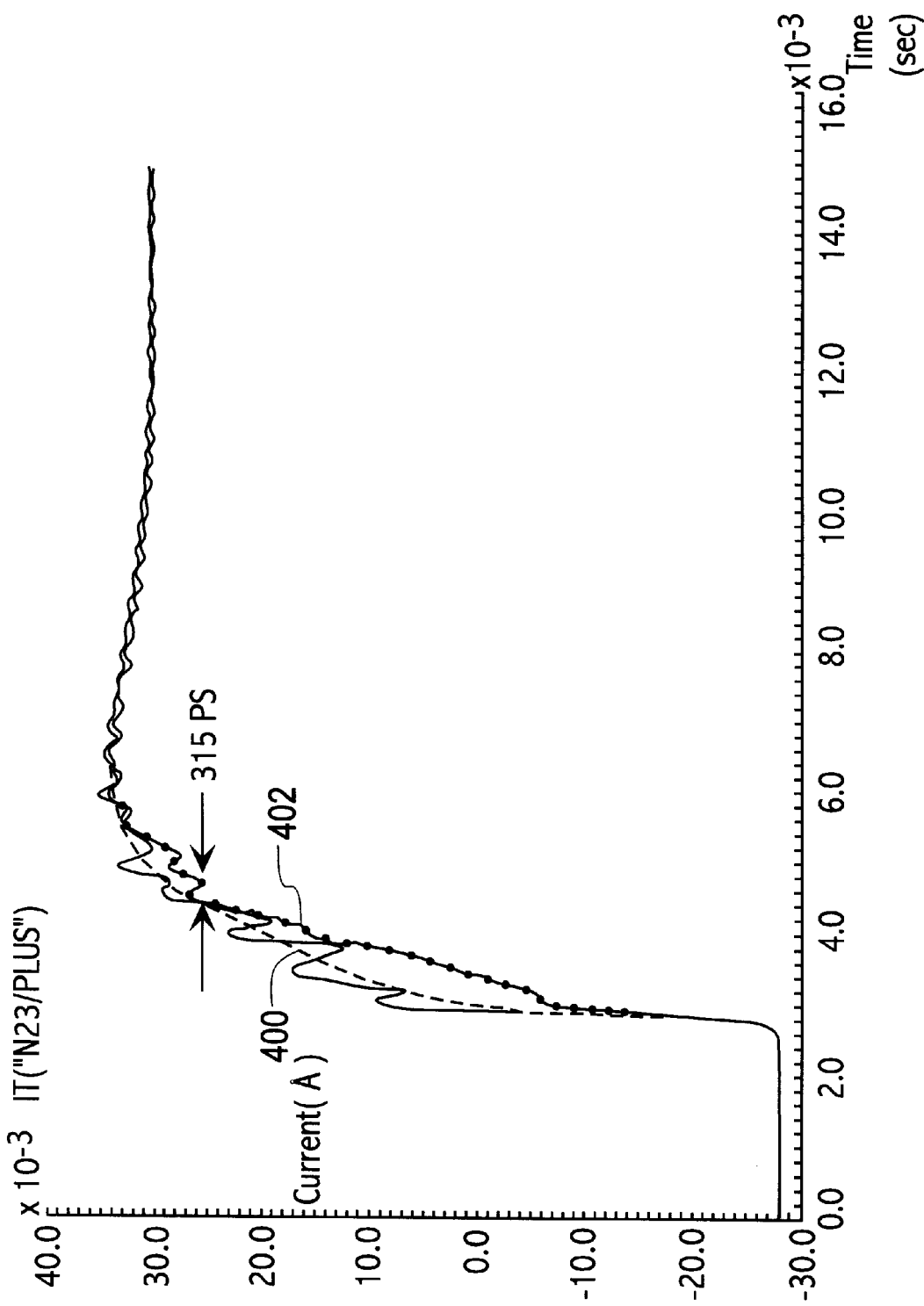
FIG. 6 is a graph illustrating a difference in risetime between a pulse generated by a conventional write circuit and a pulse generated by a circuit according to embodiments of the present invention.

FIG. 6 is a graph comparing rise time between a circuit according to an embodiment of the present invention and a conventional circuit, such as the circuit shown in FIG. 2. Results for rise times are similar to results for fall times. Result 400 represents the rise time of a current according to an embodiment of the present invention, such as the circuit shown in FIG. 4, while result 402 represents rise time according to a conventional circuit, such as that shown in FIG. 2. It is estimated that the improvement shown in this diagram, facilitated by an embodiment of the present invention, may be approximately 315 pico seconds. An estimated average of improved risetime may be approximately 150 pico seconds. However, an improvement in the risetime may be as much as 400 pico seconds. Improvements depend heavily on customer hardware selection and preferences on load and various equipment.

Figure 7:
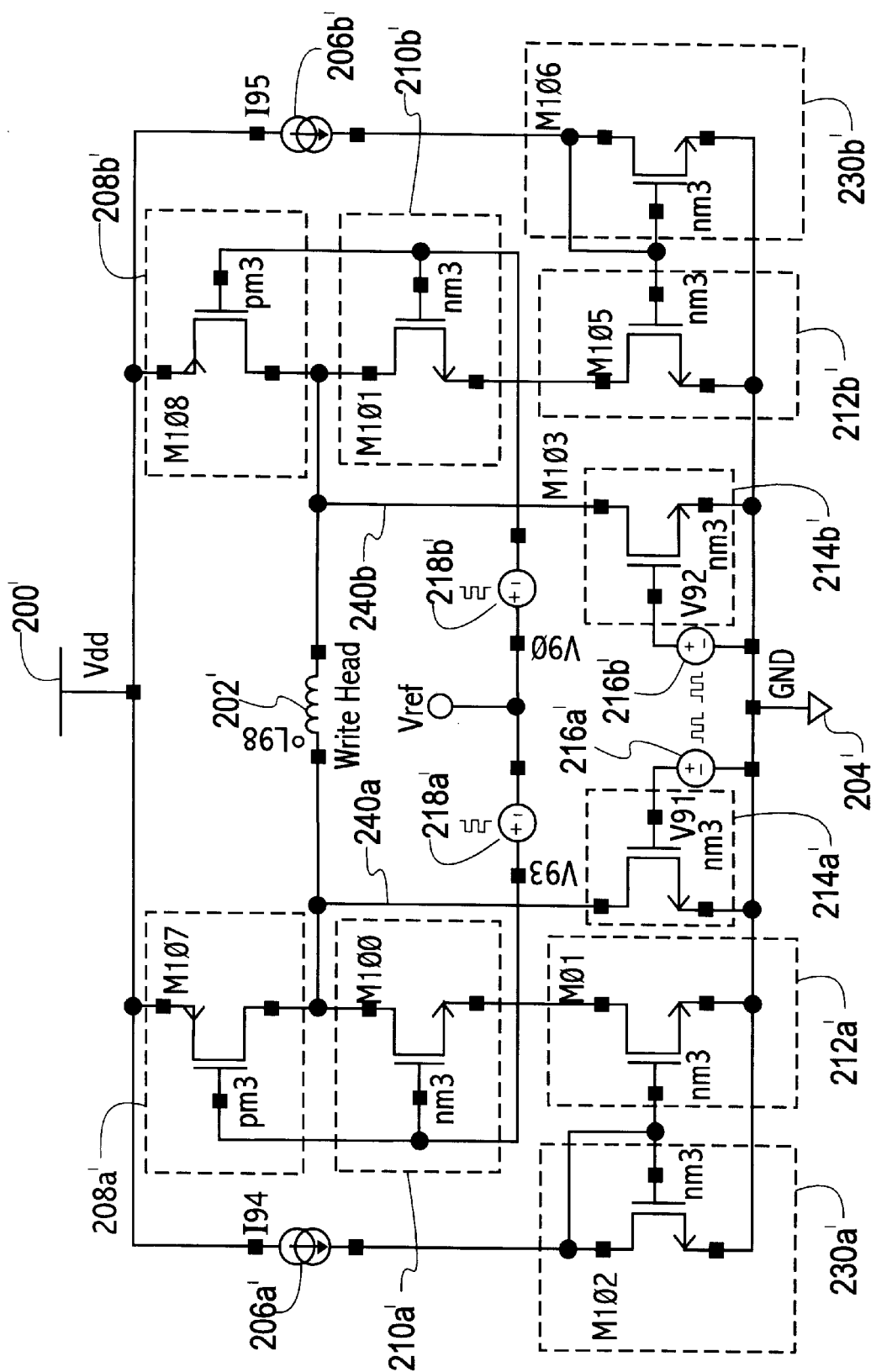
FIG. 7 is a schematic diagram of a write circuit according to a second embodiment of the present invention.

FIG. 7 is a schematic diagram of a write circuit according to a second embodiment of the present invention. The difference between the circuit shown in FIG. 7 and the circuit shown in FIG. 4 is that transistors 214A' and 214B' are directly connected to write head 202' through connections 240A and 240B. Accordingly, during rise/fall times, the current flows from write head 202' directly to transistors 214A' and 214B' during alternate half cycles of the write cycle. During the remainder of the write cycle (non-rise/fall times), the current flows through current mirror sources 212A' and 212B'. Accordingly, in this embodiment, transistors 210A' and 210B' are bypassed during rise/fall times as well as current mirror sources 212A'0 and 212B'.

Figure 8:
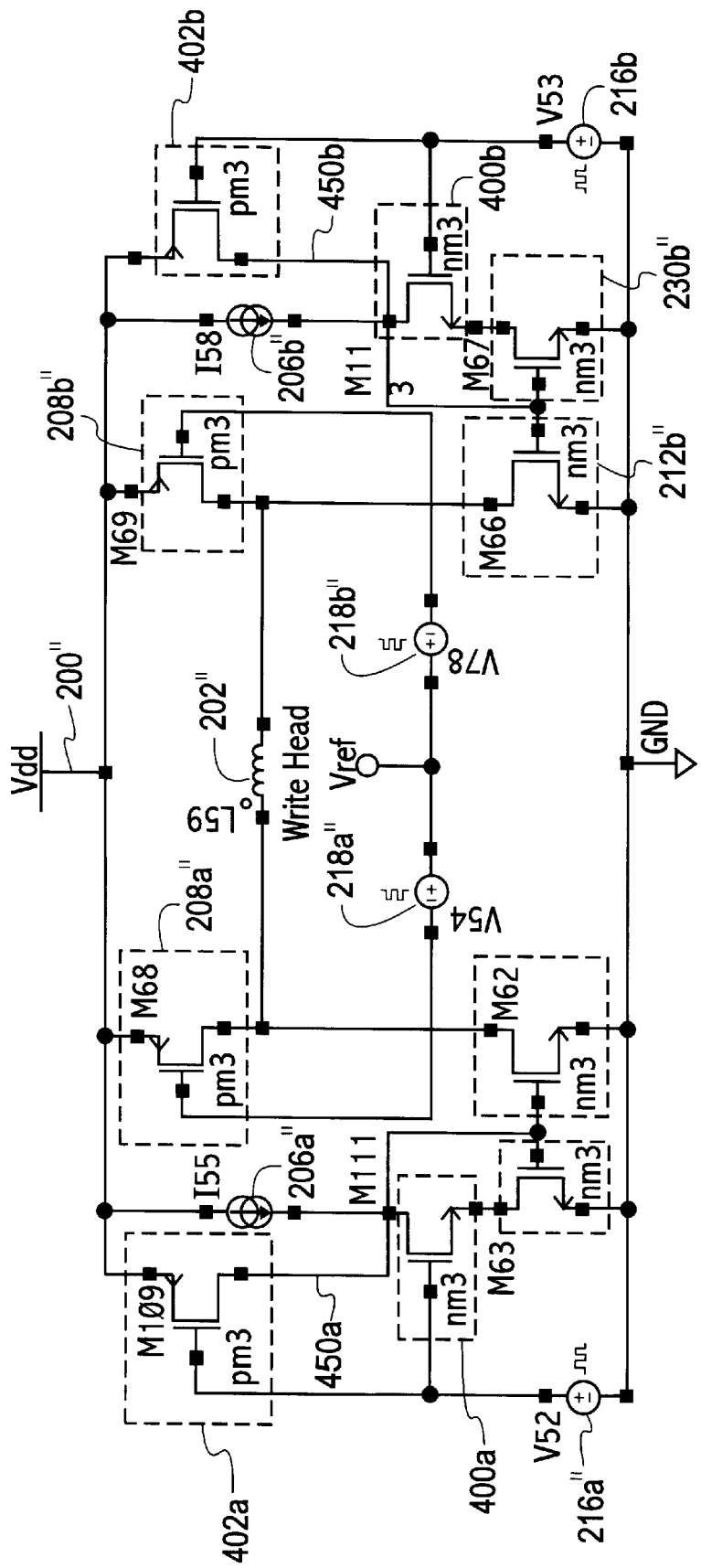
FIG. 8 is a schematic diagram of a write circuit according to a third embodiment of the present invention.

FIG. 8 is a schematic diagram of a write circuit according to a third embodiment of the present invention. In this embodiment, current mirror sources 212A" and 212B" are turned "on" and bypass current to ground themselves during rise/fall times. Reference current sources 206A" and 206B" are still coupled to current mirror sources 212A", 230A" and 212B", 230B". However, there is another transistor 400A located between reference current source 206A" and current mirror source 230A", 212A". Likewise, a transistor 400B is located between reference current source 206B" and current mirror source 230B", 212B".

Additionally, transistor 402A is in shunt with reference current source 206A". Transistor 402A is also shown to be coupled to transistor 400A and a voltage source 216A". Transistor 402A is also coupled with transistor 212A" through connection 450A. Likewise, transistor 402B is in shunt with reference current source 206B". Transistor 402B is also shown to be coupled to transistor 400B and a voltage source 216B". Transistor 402B is also coupled with transistor 212B" through connection 450B.

During the rise/fall time of the first half of a write cycle, transistor 400B is turned "off" while transistor 402B is turned "on". During rise/fall time, a signal generated by voltage source 216B" turns transistor 402B" "on" and transistor 400B" "off", which turns transistor 212B" "on". The signal generated by voltage source 216B" is the antiphase counterparts of signal 302B of FIG. 5. Accordingly, transistor 212B" serves the same function as transistor 214B of FIG. 4 and 214B' of FIG. 7 during rise/fall time. In the first and second embodiments, as shown in FIGS. 4 and 7, current mirrors 212B and 212B' were bypassed by transistors 214B and 214B'. In this third embodiment, however, current mirror 212B" is in effect made to bypass itself by using the combination of transistors 402B, 400B and voltage source 216B" shown in FIG. 8. During rise/fall times, transistor 212B" no longer acts as a current mirror source, but rather as a low resistance transistor bypassing current to ground.

During the rise/fall time of the first half of the write cycle, the current flows from the source voltage 200" through transistor 208A", through write head 202", and through transistor 212B". Transistor 212B" is switched "on" by voltage source 216B" such that the resistance of transistor 212B" is substantially less than the resistance which would have been generated by a current mirror source.

During the write cycle when the current is steady (non-rise/fall time), transistor 402B is turned "off" and transistor 400B is turned "on", such that transistors 212B" and 230B" act together to work as current mirror sources.

Similar actions occur during the second half of the write cycle. During the rise/fall time of the second half of a write cycle, transistor 400A is turned "off" while transistor 402A is turned "on". During rise/fall time, a signal generated by voltage source 216A" turns transistor 402A "on" and transistor 400A "off", which turns transistor 212A" "on". The signal generated by voltage source 216A" is the antiphase counterpart of signal 302A of FIG. 5. Accordingly, transistor 212A" serves the same function as transistor 214A of FIG. 4 and 214A' of FIG. 7 during rise/fall time. In the first and second embodiments, as shown in FIGS. 4 and 7, current mirrors 212A and 212A' were bypassed by transistors 214A and 214A'. In this third embodiment, however, current mirror 212A" is in effect made to bypass itself by using the combination of transistors 402A, 400A and voltage source 216A" shown in FIG. 8. During rise/fall times, transistor 212A" no longer acts as a current mirror source, but rather as a low resistance transistor bypassing current to ground.

During the rise/fall time of the second half of the write cycle, the current flows from the source voltage 200" through transistor 208B", through write head 202", and through transistor 212A". Transistor 212A" is switched on by voltage source 216A" such that the resistance of transistor 212A" is substantially less than the resistance which would have been associated with a current mirror source.

During the write cycle when the current is steady (non-rise/fall time), transistor 402A is turned "off" and transistor 400A is turned "on", such that transistors 212A" and 230A" act together to work as current mirror sources.

Figure 9:
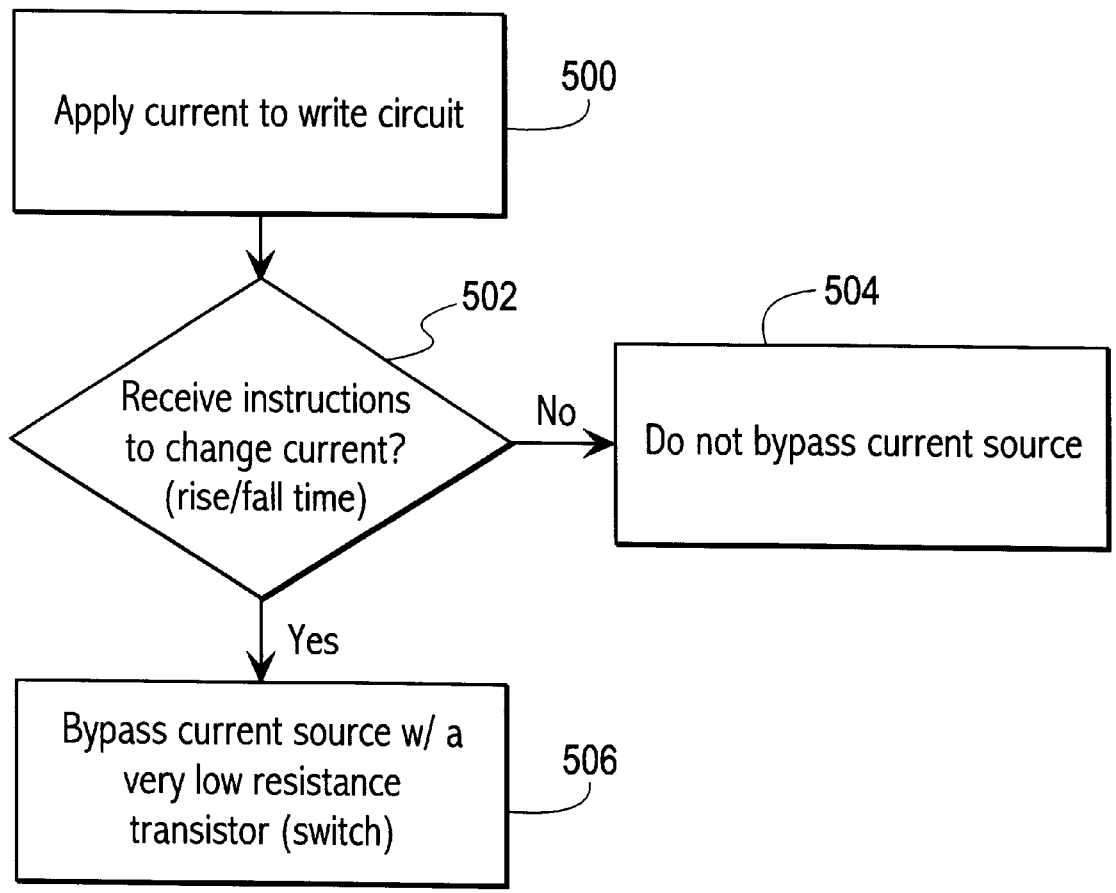
FIG. 9 is a flow diagram of a method according to an embodiment of the present invention for providing signals to a write head.

FIG. 9 is a flow diagram of a method according to embodiments of the present invention for providing a shorter time for writing data into memory by reducing rise/fall times. A current is applied to a write circuit (step 500). It is then determined whether instructions have been received to change the current (i.e. rise/fall time) (step 502). The instruction for changing the current is typically expected to be received from a controller in a disk drive assembly. If the current is not changing, then the reference current source is not bypassed (step 504). If, however, the current is changing (i.e. rise/fall time), then the reference current source is bypassed with a very low resistance transistor (switch) (step 506). Note that bypassing is herein meant to include a situation wherein the mirror current source in effect bypasses itself, as well as a situation wherein the mirror current source is bypassed due to another device, such as a transistior, working in shunt with the mirror current source.

Although the present invention has been described in accordance with the embodiment shown, one of ordinary skill in the art will readily recognize that there could be variations to the embodiment and these variations would be within the spirit and scope of the present invention. Accordingly, many modifications may be made by one of ordinary skill in the art without departing from the spirit and scope of the appended claims.

What is claimed is:

1. A write circuit for facilitating a write head for writing to a memory in a computer system, the write circuit comprising:

a supply voltage source configured to provide current to the write circuit;

a current source coupled to the supply voltage source, the current source configured to maintain the current at a predetermined value; and a switch coupled to the current source, the switch being configured to bypass the current source during a time when the current is changing.

2. The circuit of claim 1, wherein the current source is a mirrored current source.

3. The circuit of claim 1, wherein the current source is a reference current source.

4. The circuit of claim 1, further comprising a voltage source coupled with the switch to turn on the switch.

5. The circuit of claim 1, wherein the switch bypasses the current source for a predetermined time.

6. The circuit of claim 1, further comprising a second current source coupled to the supply voltage, the second current source configured to maintain the current at a second predetermined value.

7. The circuit of claim 6, further comprising a second switch coupled to the second current source, wherein the second switch is configured to bypass the second current source during a time when the current is changing.

8. The circuit of claim 1, wherein the switch is configured to bypass the current source during a time when the current is changing in a predetermined manner.

9. The circuit of claim 8, wherein the current is changing by falling.

10. The circuit of claim 8, wherein the current is changing by rising.

11. The circuit of claim 1, wherein the switch is configured to allow a current mirror transistor to regulate the current at a predetermined value during a time period when the current is not changing.

12. The method of claim 11, wherein a time between when the current begins changing and when the current is not substantially changing is user configurable.

13. The circuit of claim 1, wherein the switch is also directly coupled to the write head.

14. A write circuit for facilitating a write head for writing to a memory in a computer system, the write circuit comprising:

means for providing current to the write circuit;

means for maintaining the current at a predetermined value, the maintaining means being coupled to the providing means; and means for bypassing the maintaining means during a time when the current is changing, the bypassing means being coupled to the providing means.

15. The circuit of claim 14, wherein the maintaining means is a mirrored current source.

16. The circuit of claim 14, wherein the maintaining means is a reference current source.

17. A system for writing data to a memory, the system comprising:

a processor;

a memory coupled to the processor; and a write circuit coupled to the memory and the processor, the write circuit configured to write data to the memory, wherein the write circuit is configured to bypass a current source during a time when a current is changing.

18. The circuit of claim 17, wherein the current source is a mirrored current source.

19. The circuit of claim 17, wherein the current source is a reference current source.

20. A method for facilitating a write head for writing to a memory in a computer system, the method comprising:

providing a current to a write circuit;

changing the current; and bypassing a current source when the current is changing.

21. The method of claim 20, wherein the current is changing in a predetermined manner.

22. The method of claim 21, wherein the current is changing by falling.

23. The method of claim 21, wherein the current is changing by rising.

24. The method of claim 20, wherein the current source is bypassed with a switch.

25. The method of claim 20, wherein the current source is not bypassed if the current is not changing.

* * * * *